(12) United States Patent
Vercesi et al.

(10) Patent No.: US 10,566,982 B1
(45) Date of Patent: Feb. 18, 2020

(54) SYSTEMS AND METHODS FOR SUPPRESSING OSCILLATOR-INDUCED SPURS IN FREQUENCY SYNTHESIZERS

(71) Applicant: Marvell International Ltd., Hamilton (BM)

(72) Inventors: Luca Vercesi, Pavia (IT); Fernando De Bernardinis, Pavia (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/812,786

(22) Filed: Nov. 14, 2017

Related U.S. Application Data

(60) Provisional application No. 62/421,725, filed on Nov. 14, 2016.

(51) Int. Cl.
| | |
|---|---|
| *H03L 7/10* | (2006.01) |
| *H03L 7/107* | (2006.01) |
| *H03L 7/14* | (2006.01) |
| *H03L 7/16* | (2006.01) |

(52) U.S. Cl.
CPC .......... *H03L 7/1075* (2013.01); *H03L 7/143* (2013.01); *H03L 7/16* (2013.01)

(58) Field of Classification Search
CPC .................................................. H03L 7/1075
USPC ............................................................. 331/16
See application file for complete search history.

(56) References Cited

U.S. PATENT DOCUMENTS

| | | | | |
|---|---|---|---|---|
| 4,642,573 A | * | 2/1987 | Noda ...................... | H03D 3/242 329/308 |
| 6,005,443 A | * | 12/1999 | Damgaard .............. | H03J 5/242 331/14 |
| 2004/0033785 A1 | * | 2/2004 | Kasahara ................. | H04B 1/40 455/73 |
| 2006/0232344 A1 | * | 10/2006 | Badets .................... | H03L 7/087 331/16 |

* cited by examiner

*Primary Examiner* — Joseph Chang

(57) ABSTRACT

Embodiments described herein provide an electronic device, which includes a first oscillator configured to output a first clock signal, and a second oscillator that is co-located with the first oscillator on the electronic device. The electronic device further includes a first bandpass filter configured to filter a first input signal derived from the first clock signal received through a negative feedback loop, and to output a first signal component corresponding to the first signal spur. The electronic device further includes a signal reconstruction circuit configured to receive the first signal component and to combine the first signal component into a control signal for the first oscillator, and to feed the control signal combined with the first signal component to the first oscillator to mitigate the first signal spur exhibited in the first clock signal.

20 Claims, 9 Drawing Sheets

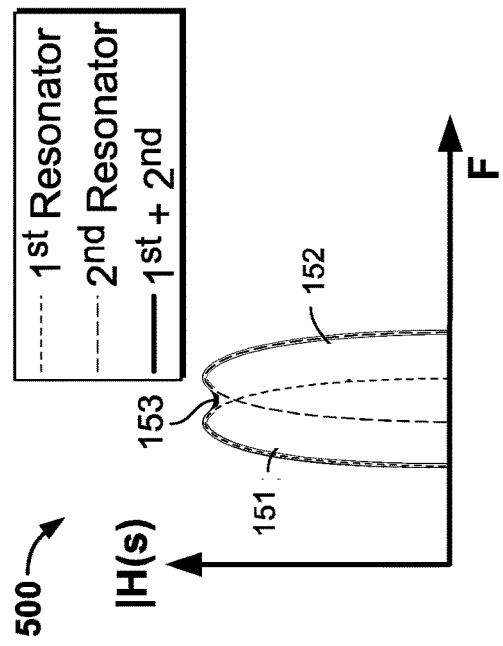
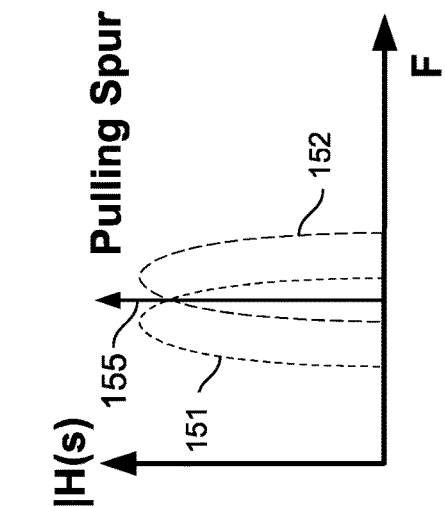
FIG. 5
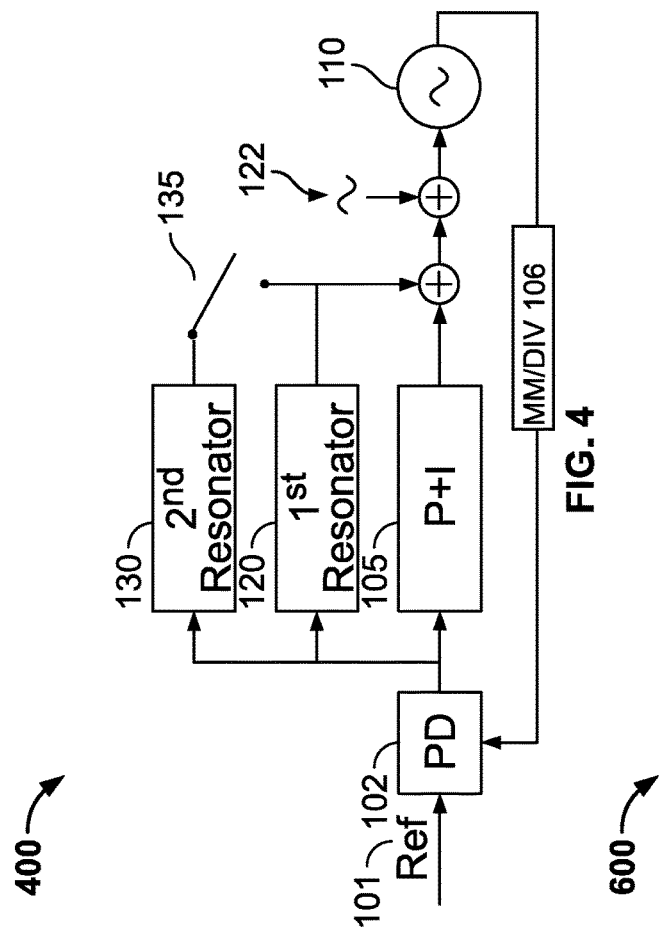
FIG. 4
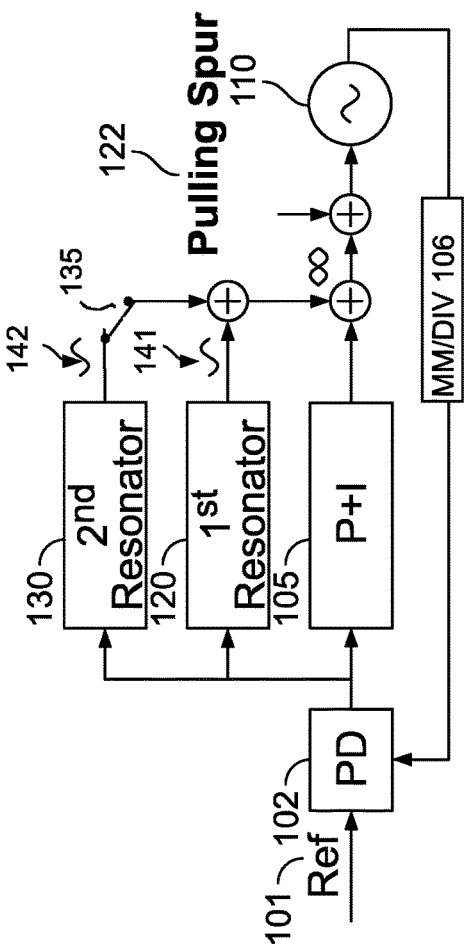
FIG. 7
FIG. 6

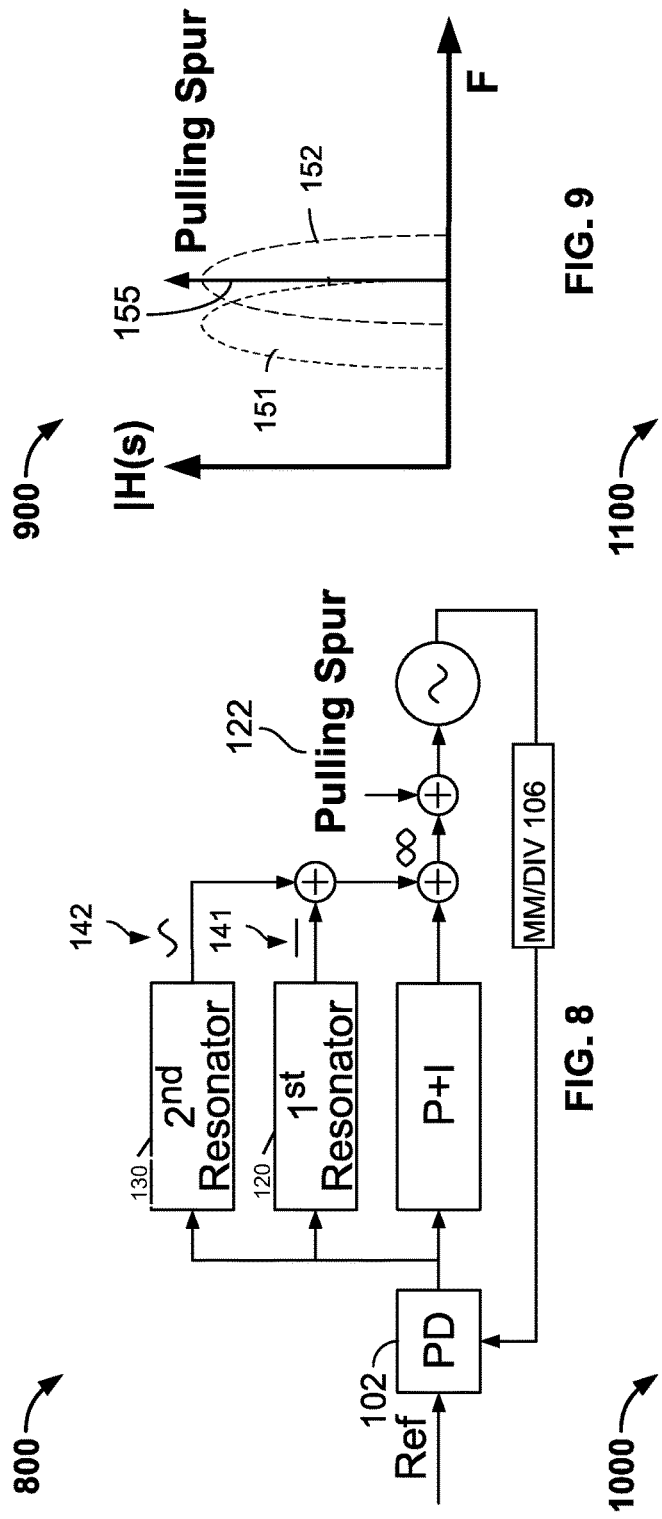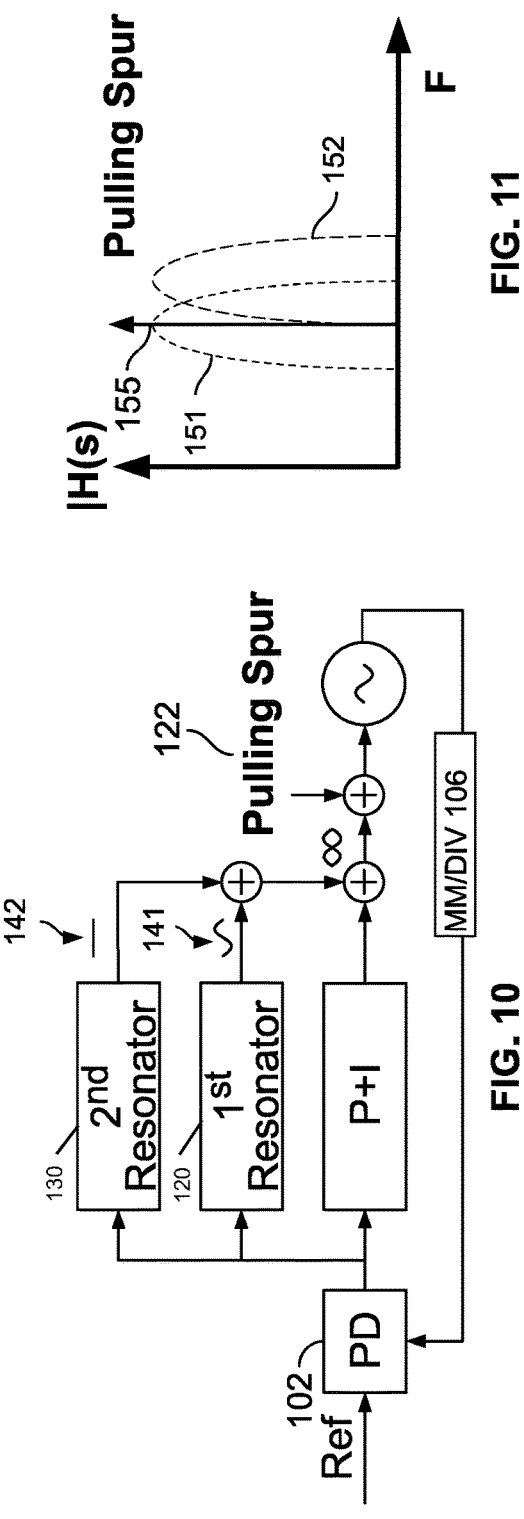

SYSTEMS AND METHODS FOR SUPPRESSING OSCILLATOR-INDUCED SPURS IN FREQUENCY SYNTHESIZERS

CROSS-REFERENCE TO RELATED APPLICATION

This disclosure claims the benefit under 35 U.S.C. § 119(e) of U.S. Provisional Patent Application No. 62/421,725, filed Nov. 14, 2016, which is hereby incorporated by reference herein in its entirety.

FIELD OF USE

This disclosure relates to noise reduction in a frequency synthesizers, and specifically, to systems and methods for suppressing oscillator-induced spurs in frequency synthesizers.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

Frequency synthesis is widely used in computing devices, such as wireless communication devices, medical devices, and so on. For example, a computer central processing unit (CPU) can be configured to generate a 1 GHz clock from a 100 MHz reference clock via frequency synthesis. A phase-locked loop (PLL) is a common type of a frequency synthesizer. A PLL typically employs a negative feedback system that locks the phase and frequency of a first signal to a second signal. In a typical PLL, the frequency of a signal output from the PLL tracks the phase and frequency of a reference input clock signal that is input to the PLL such that the rising edges of the output signal, which is fed back to the PLL, are aligned to the rising edges of the reference input clock signal. Oscillators typically are used to generate the input clock signal, or the output clock signal. However, some oscillators, such as a voltage-controlled oscillator (VCO) employed to generate the output signal, are generally sensitive to various factors such as temperature, noise in power supplies, electro-magnetic interference, etc., and thus the output signal of the VCO can sometimes be unstable, whether because of such environmental factors or because of cross talk and/or interference as a result of interaction with signals generated by other oscillators on the same electronic device. For example, when environmental noise and/or other unwanted signals enter a VCO, a spurious aberration, e.g., a "spike," can sometimes be observed in the signal power spectrum of the output clock signal from the VCO, which is referred to as "spurs" throughout this disclosure. The oscillator-induced spurs in the PLL negatively impact the performance and accuracy of the PLL.

SUMMARY

Embodiments described herein provide an electronic device, which includes a first oscillator configured to output a first clock signal, and a second oscillator that is co-located with the first oscillator on the electronic device. The second oscillator is configured to output a second clock signal, and the first clock signal exhibits a first signal spur caused by the second oscillator or by the second clock signal. The electronic device further includes a first bandpass filter configured to filter a first input signal derived from the first clock signal received through a negative feedback loop, and to output a first signal component corresponding to the first signal spur. The electronic device further includes a signal reconstruction circuit configured to receive the first signal component and to combine the first signal component into a control signal for the first oscillator, and to feed the control signal combined with the first signal component to the first oscillator to mitigate the first signal spur exhibited in the first clock signal.

In some implementations, the electronic device includes a spur detection component configured to determine a frequency or a bandwidth at which the first signal spur occurs. The first bandpass filter is configured with a center frequency corresponding to the determined frequency, and a pass bandwidth corresponding to the bandwidth. The first signal component that is passed through by the first bandpass filter is substantially equivalent to a reverse of the first signal spur to cancel out the first signal spur.

In some implementations, the spur detection component includes a power monitor coupled to the first bandpass filter. The power monitor is configured to monitor for a spurious aberration in a power level of an output signal from the first bandpass filter. The spur detection component also includes a spectrum analyzer coupled to the first bandpass filter. The spectrum analyzer is configured to measure a frequency or a bandwidth of the output signal from the first bandpass filter when the spurious aberration in the power level of the output signal is detected. The measured frequency or the measured bandwidth corresponds to the frequency or the bandwidth at which the first signal spur occurs.

In some implementations, the first bandpass filter is adaptively configured with the center frequency that is adaptively selected based on dynamic monitoring and measuring of the spurious aberration in the power level of the output signal from the first bandpass filter.

In some implementations, the first oscillator is a digitally controlled oscillator. The first bandpass filter includes a digital resonator that is implemented as a two-tap finite impulse response filter. The two-tap finite impulse response filter is configured with coefficients selected to allow the first signal component to pass through the two-tap finite impulse response filter.

In some implementations, the first clock signal exhibits a second signal spur caused by a third oscillator that is co-located on the electronic device, and the electronic device further includes a second bandpass filter placed in parallel to the first bandpass filter. The second bandpass filter is configured to filter the first input signal derived from the first clock signal received through the negative feedback loop and pass through a second signal component from the first input signal. The second signal component is substantially equivalent to a reverse of the second signal spur to cancel out the second signal spur.

In some implementations, the electronic device includes a second bandpass filter selectively decoupled from or coupled to the first oscillator. The first bandpass filter is configured with a first bandwidth and the second bandpass filter is configured with a second bandwidth. The first bandwidth corresponding to the first bandpass filter overlaps with the second bandwidth of the second bandpass filter to form a joint bandwidth that covers a range of varying frequencies of the first signal spur.

In some implementations, the second bandpass filter is adaptively decoupled from the first oscillator when the first bandpass filter is configured with a first center frequency that is substantially equivalent to a frequency at which the first signal spur occurs. The second bandpass filter is adaptively coupled to the first oscillator when the frequency at which the first signal spur occurs has changed and the changed frequency falls within the joint bandwidth.

In some implementations, the electronic device further includes a first power meter configured to measure a first power level of a first output signal from the first bandpass filter, a second power meter configured to measure a second power level of a second output signal from the second bandpass filter, and an adder configured to generate a difference between the first power level and the second power level. The electronic device further includes an accumulator coupled to the first bandpass filter and the second bandpass filter. The accumulator is configured to integrate the difference between the first power level and the second power level over a period of time. The first center frequency or the second center frequency is selectively adjusted to reduce the integrated difference between the first power level and the second power level.

In some implementations, the signal reconstruction circuit includes a loop filter placed in parallel to the first bandpass filter. The loop filter is configured to filter and enhance the first input signal derived from the first clock signal through the negative feedback loop to generate the control signal for the first oscillator. The generated control signal from the loop filter is combined with the first signal component.

Embodiments describes herein provide a method for mitigating oscillator spurs caused by interference between two or more oscillators disposed on an electronic device. A first clock signal is generated at a first oscillator. The first clock signal exhibits a first signal spur caused by a second oscillator that is co-located on the electronic device, and the second oscillator is configured to output a second clock signal. A first input signal derived from the first clock signal received through a negative feedback loop is filtered, at a first bandpass filter. A first signal component corresponding to the first spur outputting is output at the first bandpass filter. The first signal component is received and combined into a control signal for the first oscillator. The control signal combined with the first signal component corresponding to the first signal spur is fed to the first oscillator to mitigate the first signal spur exhibited in the first clock signal.

In some implementations, a frequency or a bandwidth at which the first signal spur occurs is determined at a spur detection component. The first bandpass filter is configured with a center frequency corresponding to the determined frequency and pass bandwidth corresponding to the bandwidth. The first signal component is output by the first bandpass filter to be substantially equivalent to a reverse of the first signal spur to mitigate the first signal spur.

In some implementations, a power level of an output signal from the first bandpass filter for a spurious aberration is monitored via a power monitor coupled to the first bandpass filter. A frequency or a bandwidth of the output signal from the first bandpass filter is measured via a spectrum analyzer coupled to the first bandpass filter when the spurious aberration in the power level of the output signal. The measured frequency or the measured bandwidth corresponds to the frequency or the bandwidth at which the first signal spur occurs.

In some implementations, the center frequency for the first bandpass filter is selected based on dynamic monitoring and measuring of the spurious aberration in the power level of the output signals from the first bandpass filter.

In some implementations, the first oscillator is a digitally controlled oscillator, and the first bandpass filter comprises a digital resonator that is implemented as a two-tap finite impulse response filter. Coefficients are selected for the two-tap finite impulse response filter to allow the first signal component to pass through the two-tap finite impulse response filter.

In some implementations, the first clock signal exhibits a second signal spur caused by a third oscillator that is co-located on the electronic device. The first input signal derived from the first clock signal received through the negative feedback loop and pass through a second signal component from the first input signal is filtered, via a second bandpass filter placed in parallel to the first bandpass filter. The second signal component is substantially equivalent to a reverse of the second signal spur to cancel out the second signal spur.

In some implementations, a second bandpass filter is selectively decoupled from, or coupled to the first oscillator. The first bandpass filter is configured with a first bandwidth and the second bandpass filter is configured with a second bandwidth. The first bandwidth corresponding to the first bandpass filter is selected to overlap with the second bandwidth of the second bandpass filter to form a joint bandwidth that covers a range of varying frequencies of the first signal spur.

In some implementations, a frequency at which the first signal spur occurs is detected. The first bandpass filter is configured with a first center frequency substantially equivalent to the frequency corresponding to the first signal spur. In response to detecting that the frequency at which the first signal spur occurs has changed, the second bandpass filter is adaptively coupled to the first oscillator. The second bandpass filter is configured with a second center frequency such that the changed frequency corresponding to the first signal spur falls within the joint bandwidth.

In some implementations, a first power level of a first output signal from the first bandpass filter is measured, via a first power meter. A second power level of a second output signal from the second bandpass filter is measured, via a second power meter. A difference between the first power level and the second power level is calculated. The difference between the first power level and the second power level over a period of time is integrated, via an accumulator coupled to the first bandpass filter and the second bandpass filter. In response to the integrated difference between the first power level and the second power level over a period of time, the first center frequency or the second center frequency is adjusted to reduce the integrated difference between the first power level and the second power level.

In some implementations, the first input signal derived from the first clock signal through the negative feedback loop tso generate the control signal for the first oscillator is filtered and enhanced, via a loop filter placed in parallel to the first bandpass filter. The generated control signal is combined with the first signal component before feeding the generated control signal to the first oscillator.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which:

FIG. 4 is a block diagram illustrating an example circuit structure of a PLL implemented with resonators adaptively connected to the PLL to suppress output spurs, when one of the resonators is decoupled from the output of the PLL, according to some embodiments described herein;

FIG. 5 is a data plot diagram illustrating an example bandwidth of the PLL implemented in FIG. 4, according to some embodiments described herein;

FIG. 6 is a block diagram illustrating an example circuit structure of a PLL implemented with resonators adaptively connected to the PLL to suppress output spurs, when all resonators are coupled from the output of the PLL, according to some embodiments described herein;

FIG. 7 is a data plot diagram illustrating an example bandwidth of the PLL implemented in FIG. 7 and an example pulling spur, according to some embodiments described herein;

FIGS. 8-11 are block diagrams and data plot diagrams, respectively, illustrating example spurs at different frequencies within the same example PLL illustrated in FIG. 6, according to some embodiments described herein;

DETAILED DESCRIPTION

Figure 1:
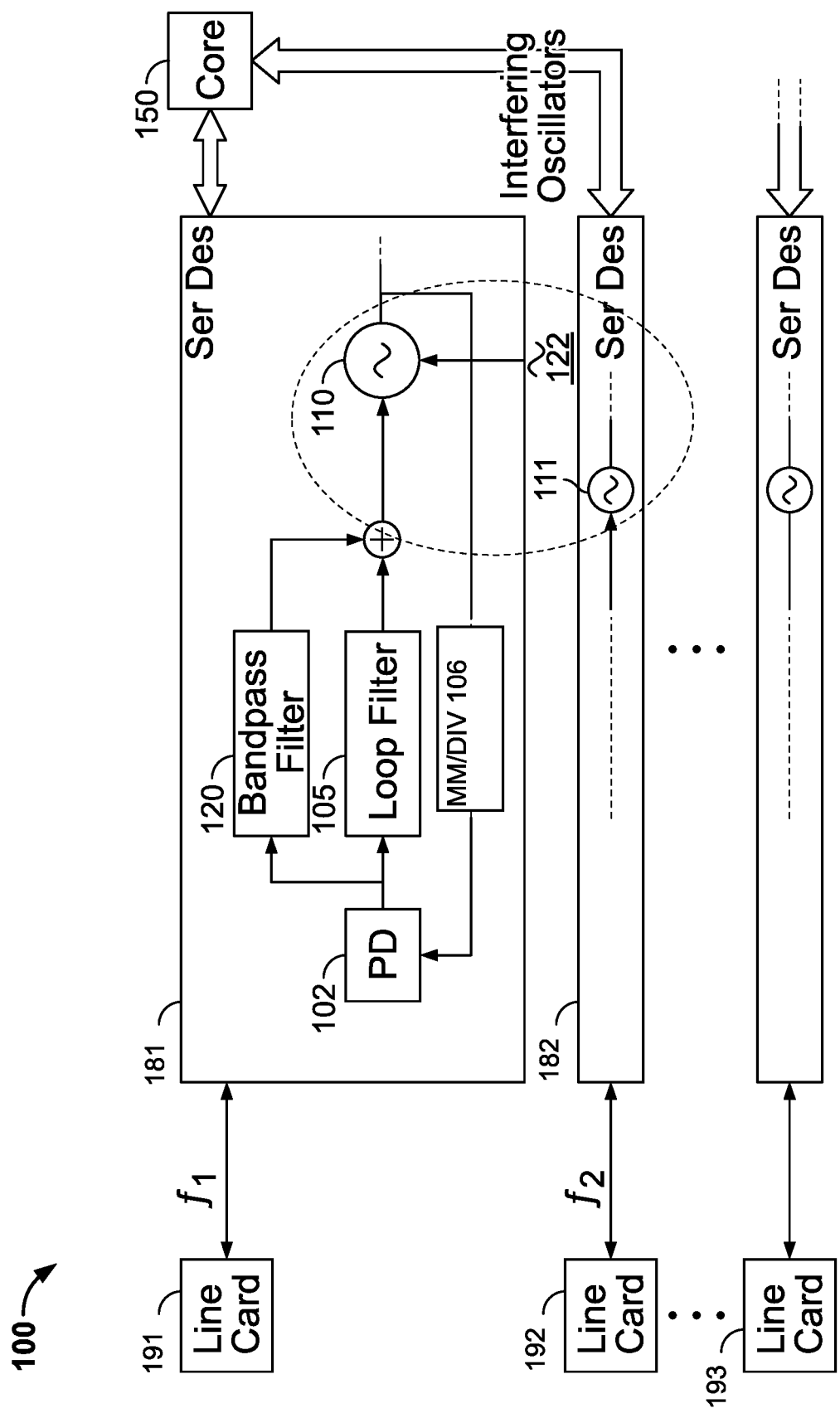
FIG. 1 is a block diagram illustrating an example circuit structure of an electronic device having one or more co-located oscillators and mechanism to mitigate output signal spur at an output oscillator caused by interference between the oscillators, according to some embodiments described herein.

This disclosure describes methods and systems for adaptive suppression for oscillator-induced spurs in frequency synthesizers. For example, when a circuit includes one or more oscillators, the clock signal generated from one of the oscillators is sometimes affected by interference between the oscillators, causing a spurious aberration in the clock signal. For another example, for a network device that includes a number of serializers and deserializers (e.g., see 181, 182 in FIG. 1), each of which is configured to communicate with different devices and each has its own oscillator to generate a clock signal, interference between oscillators on the same circuit cause spurs in the clock signals generated from the oscillators. Specifically, such signal spurs are likely to be added to the oscillator output signals, e.g., see 122 in FIG. 1. Embodiments described herein provide a bandpass filter added to the device with a pass band configured to be centered around the frequency of the signal spur such that any spur signal component that enters the bandpass filter through a negative feedback loop from an output oscillator of the circuit is passed through by the bandpass filter. In this way, the spur signal component via the negative feedback loop is passed and routed to the output oscillator, in a form that is substantially equivalent to a reverse of the original signal spur, to suitably cancel, mitigate or attenuate the spur signal at the output oscillator, e.g., as further illustrated in FIG. 1. In some embodiments, multiple bandpass filters are placed in parallel and configured to be adaptively or selectively coupled or decoupled to the output oscillator so that different bandwidths of a pass band are achieved to cater for possible changes in the frequency of the spur signal, as shown in various examples illustrated in FIGS. 2-11. In some embodiments, to adaptively or selectively configure the center frequencies of the multiple bandpass filters, a feedback loop is used to adaptively tune the center frequencies and/or bandwidths of the bandpass filters, as further illustrated in FIG. 12. In some embodiments, to select the center frequency of one or more bandpass filters, the frequency of the signal spur that occurs at the output oscillator is detected and tracked, e.g., by detecting a spurious aberration of the power level of an output signal and determining the frequency at which the spurious aberration occurs, as further illustrated in FIG. 13.

As used herein, the term "spur" is defined to mean a spurious aberration in a signal, which is expressed as an additive signal component, e.g., as shown as the signal spur 122 throughout FIGS. 1-13. As used herein, the term "substantially equivalent" is defined to mean mathematically equivalent within a tolerable range of measurement or perception errors.

It is noted that embodiments illustrated in FIGS. 1-12 are implemented via a PLL circuit for illustrative purpose only. The mechanism of mitigating a signal spur at an output oscillator discussed herein can be implemented at any suitable circuit that has a negative feedback loop.

FIG. 1 is a block diagram illustrating an example circuit structure 100 of an electronic device having one or more co-located oscillators and mechanism to mitigate an output signal spur 122 caused by interference between the oscillators, according to some embodiments described herein. The example circuit structure 100 of the electronic device is implemented as a network device, which includes a plurality of serializers and/or deserializers 181-182. Each of the serializers and/or deserializers 181-182 is configured to be controlled by a core processor 150 (e.g., a processor at a host computer) to communicate with the line cards 191-193, respectively. Specifically, each of the serializers and deserializers 181-182 includes at least one oscillator 110, 111, respectively, which is sometimes part of a PLL circuit. At times, the different oscillators 110-111 at different serializers or deserializers 181-182 on the same device 100 are configured to operate at different frequencies, causing interferences between the oscillators 110-111. Specifically, the interference between the oscillators 110-111 affects the output signal of the oscillator 110, causing a spurious aberration in the form of an output signal spur 122 that is added to the output signal generated by the oscillator 110.

For example, as shown at serializer/deserializer 181, the oscillator 110 is placed at an output of a feedback circuit, such as a PLL. The PLL typically includes a phase detector (PD) 102 that is configured to detect a phase difference between a reference clock signal not shown in FIG. 1) and the output clock signal generated from the output oscillator 110, which is received and fed into PD 102 via a negative feedback loop. The negative feedback loop usually includes, in an embodiment, a multi-modulus divider 106 to sample the clock signal from the oscillator 110 such that the frequency of the clock signal is divided to be matched with and to be compared against the reference signal at PD 102. Thus, the signal spur 122, which is combined into the clock signal generated from the oscillator 110 as a spur signal component, is fed to PD 102, and then in turn passed on to the input of the bandpass filter 120 and the loop filter 105.

Various spurs can originate at different components within the PLL. As shown at the serializer/deserializer 181, a signal spur 122 caused by the interference between the oscillators 110 and 111 on the same device 100 is sometimes added to the clock signal generated by the oscillator 110. As discussed above, when the oscillator 110 is placed at the output of the PLL, the signal spur 122 enters the input end at the PD 102 via the negative feedback loop as a negative spur signal component. The bandpass filter 120 is used to filter the output from the PD 102, which contains the negative spur signal component. The negative spur signal component is substantially equivalent to a reverse of the signal spur 122. The band shape and/or bandwidth of the bandpass filter 120 is selected to match the band shape and/or the bandwidth of the signal spur 122 in the frequency domain, in an embodiment. For example, in an embodiment, an LC filter, i.e., a resonator, is used to implement the bandpass filter 120. The center frequency of the bandpass filter 120 is tuned to match the frequency of the signal spur 122. In this way, when the signal spur 122 is added to the clock signal from the oscillator 110, and then fed to the input of the PD 102 via the negative feedback loop, the negative spur signal component contained in the input to the bandpass filter 120 is passed through by the bandpass filter 120 and then fed to the oscillator 110 to cancel, mitigate or attenuate the signal spur 122.

Figure 13:
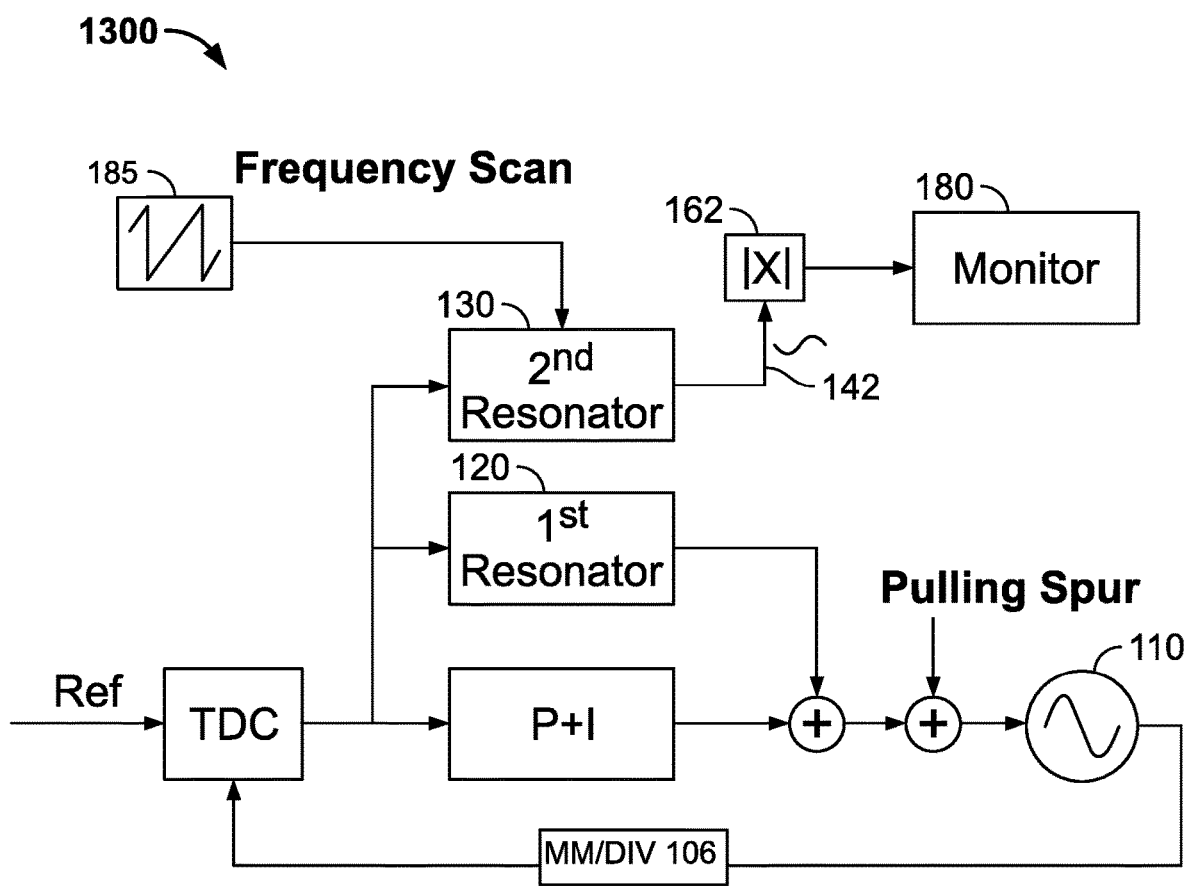
FIG. 13 is a block diagram illustrating an example circuit structure of a PLL implemented with multiple resonators (similar to the PLL in FIG. 4) and implemented with a power monitor and a spectrum analyzer for spur detection, according to some embodiments described herein.

To configure the center frequency and/or the bandwidth of the bandpass filter 120, the frequency and/or bandwidth of the signal spur 122 is monitored and measured, e.g., as further discussed in relation to FIG. 13.

The loop filter 105, as part of the PLL, is configured to receive and filter the detected phase difference from PD 102 to generate a control signal for the output oscillator 110, e.g., the output oscillator 110 may be triggered at a rising edge of the control signal. In some embodiments, the loop filter is configured as a low pass filter that is implemented as an integrator that integrates low-frequency phase errors, denoted by "P+I" as shown at 105 in FIGS. 2-4, 6, 8, 10, 12 and 13. The output of the loop filter 105, e.g., the generated control signal for the oscillator 110, is then combined with the output from the bandpass filter 120, e.g., a signal component that is substantially equivalent to the reverse of the signal spur 122, via an adder. Thus, the output from the PD 102, after being filtered by different filters 105 and 120, is reconstructed at the adder by adding the outputs from the different filters 105 and 120 to generate the combined control signal. The combined control signal is then fed to the oscillator 110, which suitably actively cancels or mitigates the signal spur 122 at the oscillator 110.

In some embodiments, when the output oscillator 110 is an analog voltage-controlled oscillator, the control signal is a voltage signal. In some embodiments, when the output oscillator 110 is a digitally-controlled oscillator 115 as shown in FIG. 3, the control signal is a digital signal.

Figure 2:
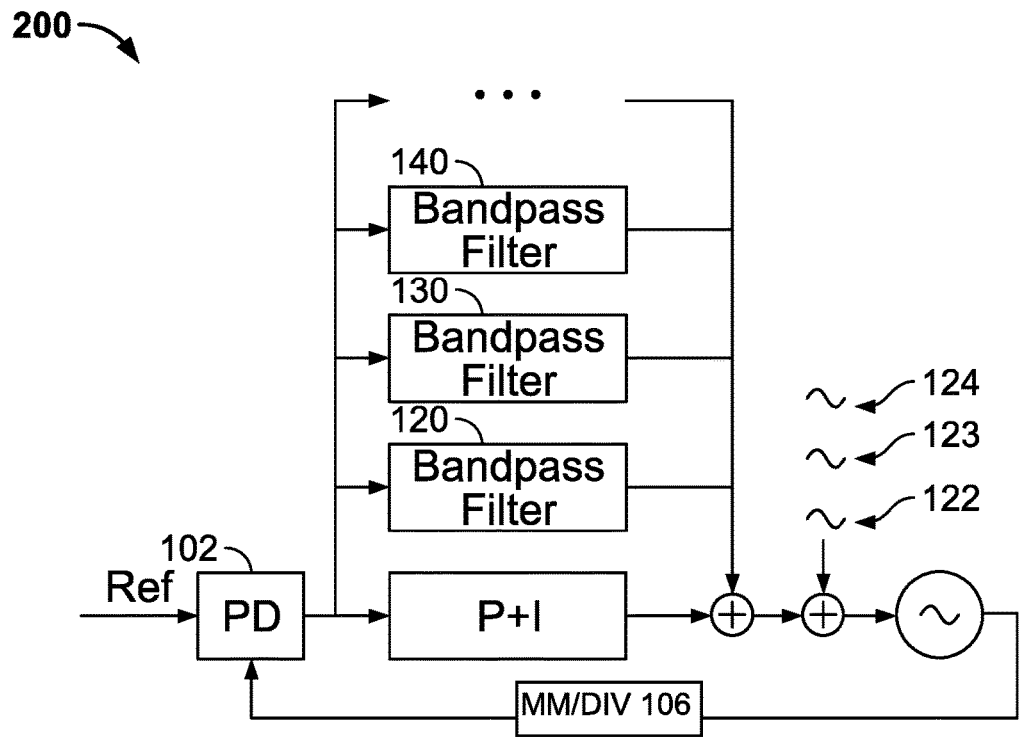
FIG. 2 is a block diagram illustrating an example circuit structure of a PLL, which is similar to that illustrated in FIG. 1, but implemented with multiple bandpass filters placed in parallel to suppress output spurs having different frequencies, according to some embodiments described herein.

FIG. 2 is a block diagram illustrating an example circuit structure 200, which is similar to that illustrated in FIG. 1, but implemented with multiple bandpass filters placed in parallel to mitigate signal spurs having different frequencies, according to some embodiments described herein. As described in relation to FIG. 1, the center frequency of the bandpass filter 120 is selected to match the frequency of the signal spur 122. When multiple signal spurs 122, 123, 124 are added to the clock signal from the oscillator 110, e.g., each caused by a different interfering oscillator on the same device that operates at a different frequency, multiple bandpass filters are used in parallel. For example, multiple bandpass filters 120, 130 and 140 are placed in parallel to the loop filter 105, and each center frequency of each respective bandpass filter 120, 130 or 140 corresponds to a frequency at which a respective signal spur 122, 123 or 124 occurs. In this way, each bandpass filter is able to pass through a signal component that is substantially equivalent to a reverse of the signal spur 122,123 and 124, respectively, which is then used to mitigate or cancel the respective signal spur at the oscillator 110.

The three bandpass filters 120, 130 and 140 in the embodiment of FIG. 2 are for illustrative purpose only, and any other number of parallel bandpass filters can be used to mitigate or cancel a different number of signal spurs at the oscillator 110, e.g., two, four, five, etc.

Figure 3:
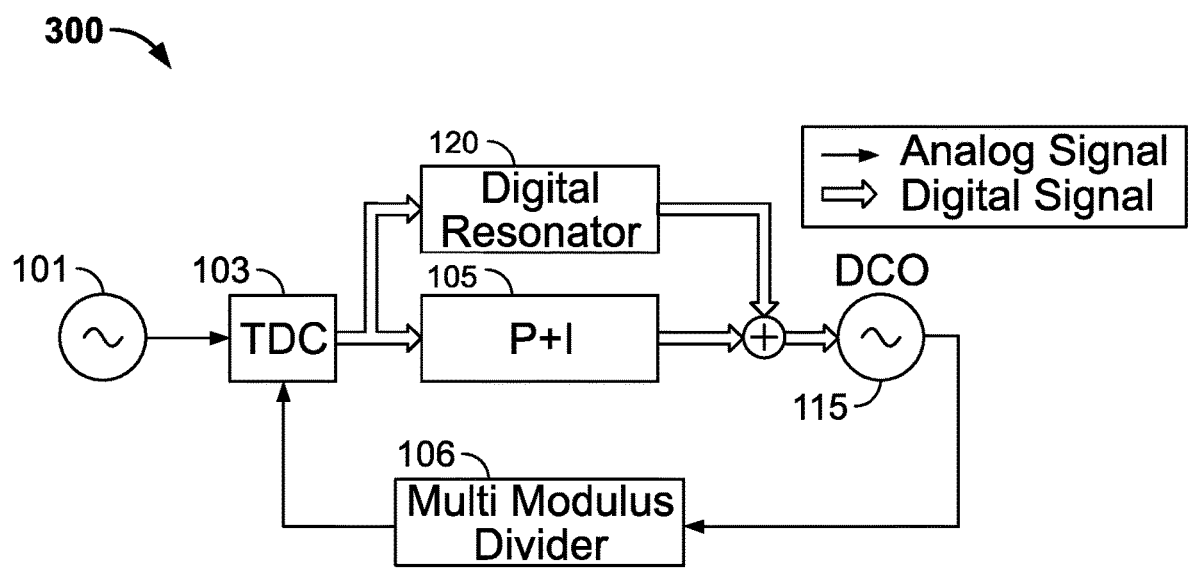
FIG. 3 is a block diagram illustrating an example circuit structure of a digital PLL implemented with a digital resonator to suppress output spurs, according to some embodiments described herein.

FIG. 3 is a block diagram illustrating an example circuit structure of a digital PLL 300 implemented with a digital resonator 120 to mitigate signal spurs, according to some embodiments described herein. In the digital PLL 300, the loop filter 105 is implemented by a digital block, e.g., a discrete-time signal processing (DSP) unit. The loop filter 105 is configured to generate a digital control signal to trigger the digitally-controlled oscillator (DCO) 115. A time-to-digital converter (TDC) 103 is configured to detect the phase difference between a reference clock signal and an output clock signal generated from the DCO 115, in a similar manner as PD 102 in FIG. 1, but instead generate a digital phase difference for the digital loop filter 105. A digital resonator 120 is added in parallel to the digital loop filter 105, and is configured to pass through the spur signal component from the output of the TDC 103 to mitigate or cancel the signal spur at DCO 115, in a similar manner as the bandpass filter 120 functions as described in FIG. 1. In some embodiments, the digital resonator 120 is implemented as a two-tap finite impulse response (FIR) filter built on a DSP unit.

FIG. 4 is a block diagram illustrating an example circuit structure 400 implemented with resonators 120, 130 adaptively or selectively connected to the PLL to mitigate or cancel signal spurs, when one of the resonators 130 is decoupled from the output of the PLL, according to some embodiments described herein. In FIGS. 1-3, the circuits are implemented to mitigate signal spurs when the frequency of the signal spur is known, or has been detected (as further described in FIG. 13). Sometimes, depending on the device and environment, spur presence and location can be unknown, and/or the spur frequency can change over time. PLL 400 in FIG. 4 shows an adaptive scheme that allows detecting and tracking signal spurs.

As described in relation to FIG. 2, multiple bandpass filters (e.g., resonators) are configured to mitigate multiple signal spurs at different frequencies. In PLL 400, multiple bandpass filters are configured to be adaptively or selectively coupled to PLL 400 to provide different combinations of center frequencies or bandwidths to adapt to a varying signal spur 122. For example, a first resonator 120 and a second resonator 130 are placed in parallel to the loop filter 105, but one end of the second resonator 130 is configured to be coupled, or decoupled, e.g., via a switch 135, to the input of the output oscillator 110 adaptively, depending on the frequency of the signal spur 122.

For example, when the first resonator 120 is selected with a center frequency that matches the frequency of the signal spur 122, the switch 135 is open and the second resonator 130 is not connected to the output oscillator 110. In this way, PLL 400 works in a similar manner as the PLL inside the circuit block 181 described in relation to FIG. 1. When the frequency of the signal spur 122 changes over time and the changed frequency deviates from the previously configured center frequency of the first resonator 120, the switch 135 is closed and the second resonator 130 is connected to the output oscillator 110. In this way, the first resonator 120 and the second resonator 130 contribute to a combined bandwidth that still passes through the changed frequency at which the signal spur 122 occurs. Further examples of the scenarios when the switch 135 is closed and the second resonator 130 is connected to the output oscillator 110 are shown in FIGS. 6-11. Further detail of detecting the frequency of the spur signal is described in relation to FIG. 13.

FIG. 5 is a data plot diagram illustrating an example bandwidth of the PLL implemented in FIG. 4, according to some embodiments described herein. In the plot 500, the center frequency and the band shape 151 of the first resonator 120, and the center frequency and the band shape 152 of the second resonator 130 are selected such that the bandwidth of the first resonator 120 overlaps with the bandwidth of the second resonator 130. In this way, the band shape 151 joins the band shape 152 to form a larger band shape 153, which has a larger bandwidth and thus adapts to a broader range of varying frequencies of the signal spur. For example, when the frequency of the signal spur 122 changes over time and falls outside the bandwidth 151 of the first resonator 120, the frequency of the spur signal may still fall within the joint bandwidth 153 which includes the bandwidth 152 of the second resonator 130.

FIG. 6 is a block diagram illustrating an example circuit structure of a PLL 600 implemented with resonators 120, 130 adaptively connected to the PLL 600 to suppress signal spurs, when all resonators 120 and 130 are coupled from the output of the PLL, and FIG. 7 is a data plot diagram 700 illustrating an example bandwidth of the PLL implemented in FIG. 6 and an example frequency 155 at which the signal spur occurs, according to some embodiments described herein. As described above, a broader bandwidth of the resonators to adapt to the signal spur is achieved when two resonators 120 and 130 are both coupled to the PLL, e.g., when the switch 135 is closed. For example, as discussed in relation to FIG. 4, in the beginning, the center frequency of the first resonator 120 is selected to match with the frequency of the signal spur 122—in this case, the second resonator 130 is decoupled from the oscillator 110 when the switch 135 is open. When the frequency of spur signal 122 shifts over time, e.g., as shown at data plot diagram 700, the frequency 155 of the signal spur is no longer positioned at the center of the bandwidth 151 of the first resonator 120. The second resonator 130 is then configured to be coupled to the circuit, e.g., with the switch 135 closed, and the center frequency and the bandwidth of the second resonator 130 is selected such that the frequency 155 at which the signal spur occurs sis located at the center of the combined bandwidth that consists of the bandwidth 151 of the first resonator 120 and the bandwidth 152 of the second resonator 130. In this way, the combination of the first resonator 120 and the second resonator 130 is configured to pass through a negative signal component that is substantially equivalent to the reverse of the signal spur 122 which occurs at the frequency 155. In this case, the first output signal component 141 from the first resonator 120 and the second output signal component 142 from the resonator 130 are combined with the control signal generated by the loop filter 105 to mitigate or cancel the signal spur 122.

FIGS. 8-11 are block diagrams and data plot diagrams, respectively, illustrating example signal spurs at different frequencies within the same example PLL illustrated in FIG. 6, according to some embodiments described herein. As shown in diagram 900 of FIG. 9, the frequency 155 at which the signal spur 122 occurs can sometimes shift outside of the bandwidth 151 for the first resonator 120, but still stay within the bandwidth 152 for the second resonator 130. Thus, as shown at PLL 800, the output signal 141 from the first resonator 120 is substantially equivalent to zero as no signal component is passed through by the first resonator 120 when the frequency 155 of the signal spur 122 is filtered out by the bandwidth 151 of the first resonator 120. The second resonator 130 is configured to pass through a signal component 142 that is substantially equivalent to a reverse of the signal spur 122, as the bandwidth 152 of the second resonator 130 is selected to have a center frequency that is substantially equivalent to the frequency 155 at which the signal spur 122 occurs. In this way, the signal component 142 is used to mitigate or cancel the signal spur 122.

As shown in plot 1100 of FIG. 11, the frequency 155 of the spur signal 122 can sometimes shift outside of the bandwidth 152 for the second resonator 130, but still stay within the bandwidth 151 for the first resonator 120. Thus, as shown at PLL 1000, the output signal 142 from the second resonator 130 is substantially equivalent to zero, as the frequency 155 at which the signal spur 122 occurs falls outside the bandwidth 152 of the second resonator 130, and thus any signal component is filtered out by the second resonator 130. The first resonator 120 is configured to output a signal component 141 that is substantially equivalent to the reverse of the signal spur 122, as the center frequency of the bandwidth 151 is selected as substantially equivalent to the frequency 155. In this way, the signal component 141 is used to mitigate or cancel the signal spur 122.

Figure 12:
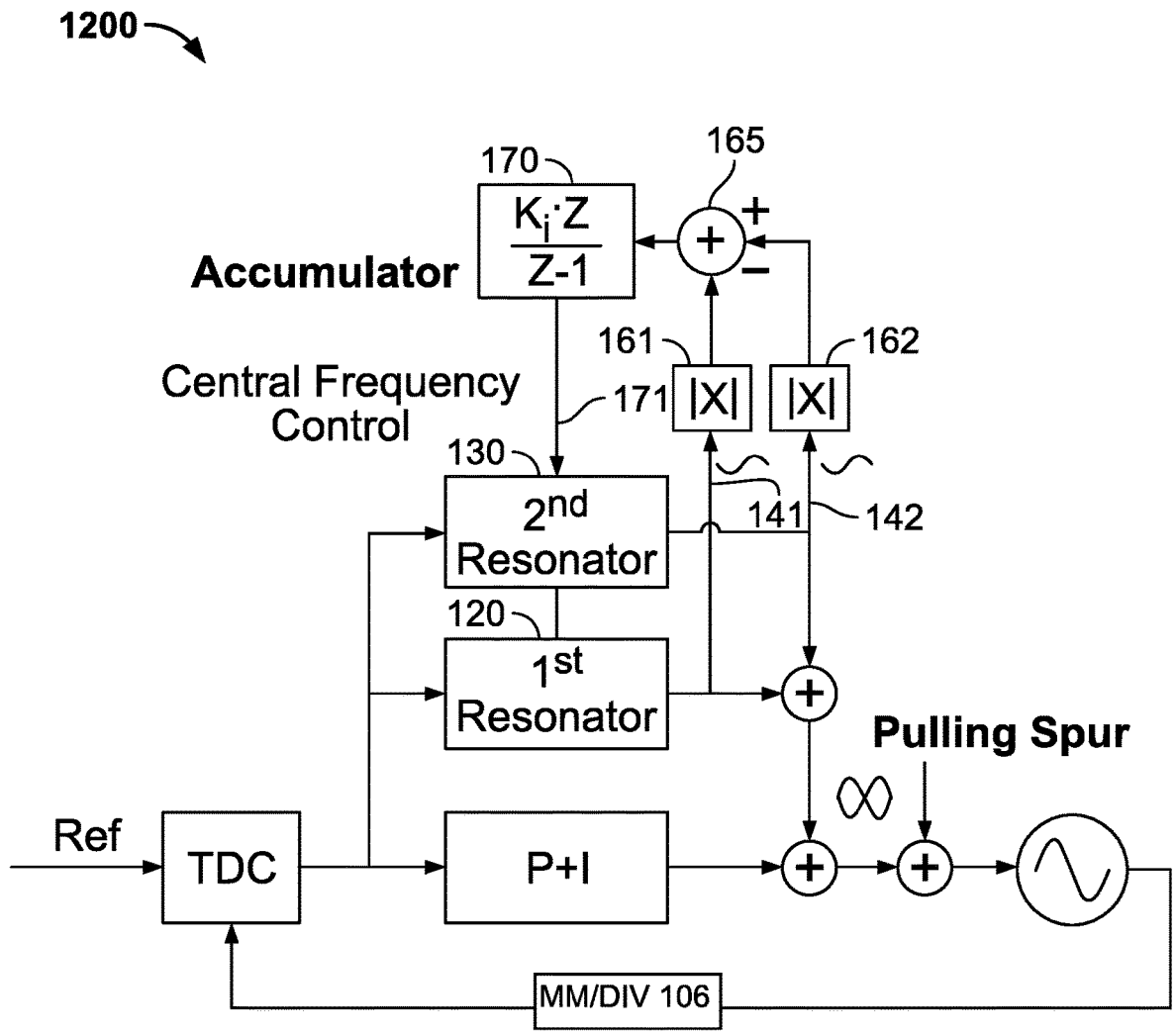
FIG. 12 is a block diagram illustrating an example circuit structure of a PLL implemented with multiple resonators (similar to the PLL in FIG. 6) and implemented with power meters and a loop integrator for adaptive resonator tuning, according to some embodiments described herein.

FIG. 12 is a block diagram illustrating an example circuit structure of a PLL 1200 implemented with multiple resonators 120, 130 (similar to the PLL 600 in FIG. 6) and implemented with power meters 161, 162 and a loop integrator 170 for adaptive resonator tuning, according to some embodiments described herein. As discussed in relation to FIGS. 6-11, the center frequencies of the first resonator 120 or the second resonator 130 can sometimes be tuned to adapt to the varying frequency of the signal spur 122. The power meters 161, 162 and the loop integrator 170 are added to the PLL to form a feedback loop to tune the frequencies of the resonators.

The power meters 161, 162 are placed at the outputs of the first resonator 120 and the second resonator 130, to measure the power level (e.g., represented by the absolute value of the magnitude of the signal) of the output signals 141 and 142, respectively. The difference of the measured powers is then calculated at the adder component 165. A loop integrator, e.g., an accumulator 170, is configured to integrate the power difference over a period of time to obtain an integrated difference as an indicator showing whether the output signal powers of the resonators 120 and 130 are far apart, which in turn indicates whether the frequency at which the signal spur 122 occurs shifts outside one of the bandwidths of the resonators 120 and 130.

For example, when the integrated difference is negative and the absolute value of the integrated difference is greater than a threshold, indicating that output signal 142 is likely to be zero and output signal 141 is relatively large, the center frequencies of the resonators and the signal spur are substantially similar to the scenario illustrate in FIGS. 10-11. In this case, the center frequencies of the resonators can be adjusted, e.g., by tuning bandwidths 151 and 152 in FIG. 11 such that the frequency 155 at which the signal spur 122 occurs is substantially equivalent to the center of the joint bandwidth formed by bandwidths 151 and 152. In this way, the output signals 141 and 142 from the two resonators 120 and 130 are more balanced such that the power difference between the output signals 141 and 142 is reduced.

For another example, when the integrated difference is positive and greater than a threshold, indicating that output signal 141 is likely to be zero and output signal 142 is relatively large, the center frequencies of the resonators and the spur signal are similar to the scenario illustrate in FIGS. 8-9. In this case, the center frequencies of the resonators can be adjusted, e.g., tuning bandwidth 151 and bandwidth 152 in FIG. 9 such that the frequency 155 is positioned in the center of the joint bandwidth formed by bandwidths 151 and 152.

For another example, when the integrated difference is close to zero, indicating that output signals 141 and 142 are likely to have a balanced power, the center frequencies of the resonators and the spur signal are similar to the scenario illustrate in FIGS. 6-7, where the frequency 155 at which the signal spur occurs is likely to locate at the center of the joint bandwidth formed by bandwidth 151 and bandwidth 152. In this case, the two resonators 120 and 130 are balanced. Therefore, by monitoring the power difference between the output signals 141 and 142 from the resonators 120 and 130, and in turn adjusting the center frequencies of the resonators 120 and 130 to reduce the power difference, the frequency at which the signal spur 122 occurs is always kept substantially similar, or at least within a small range of the center frequency of the joint bandwidth formed by the bandwidths of resonators 120 and 130. In this way, the risk of the frequency at which the signal spur 122 occurs falling outside the joint bandwidth of the resonators is reduced. Further detail of adaptively tuning the center frequencies of the resonators 120 and 130 is discussed in relation to FIGS. 14-15.

FIG. 13 is a block diagram illustrating an example circuit structure of a PLL 1300 implemented with multiple resonators (similar to the PLL in FIG. 4) and implemented with a power monitor 180 and a spectrum analyzer 185 for spur detection, according to some embodiments described herein. In PLL 1300, the second resonator 130 is decoupled from the oscillator 110, but is used to detect the signal spur 122.

A power meter 162 is connected to the output resonator 130, and the power meter 162 is connected to a power monitor 180, which is configured to monitor a power level of the output signal 142 from the second resonator 130. A spectrum analyzer 185 is coupled to the second resonator 130 and configured to scan the frequency of the second resonator 130. When a spurious aberration, e.g., a "spike," in the power level of the output signal 142 is detected by the power monitor 180, a signal spur 122 is detected corresponding to the scanned frequency from the spectrum analyzer 185 that corresponds to the signal "spike."

Figure 14:
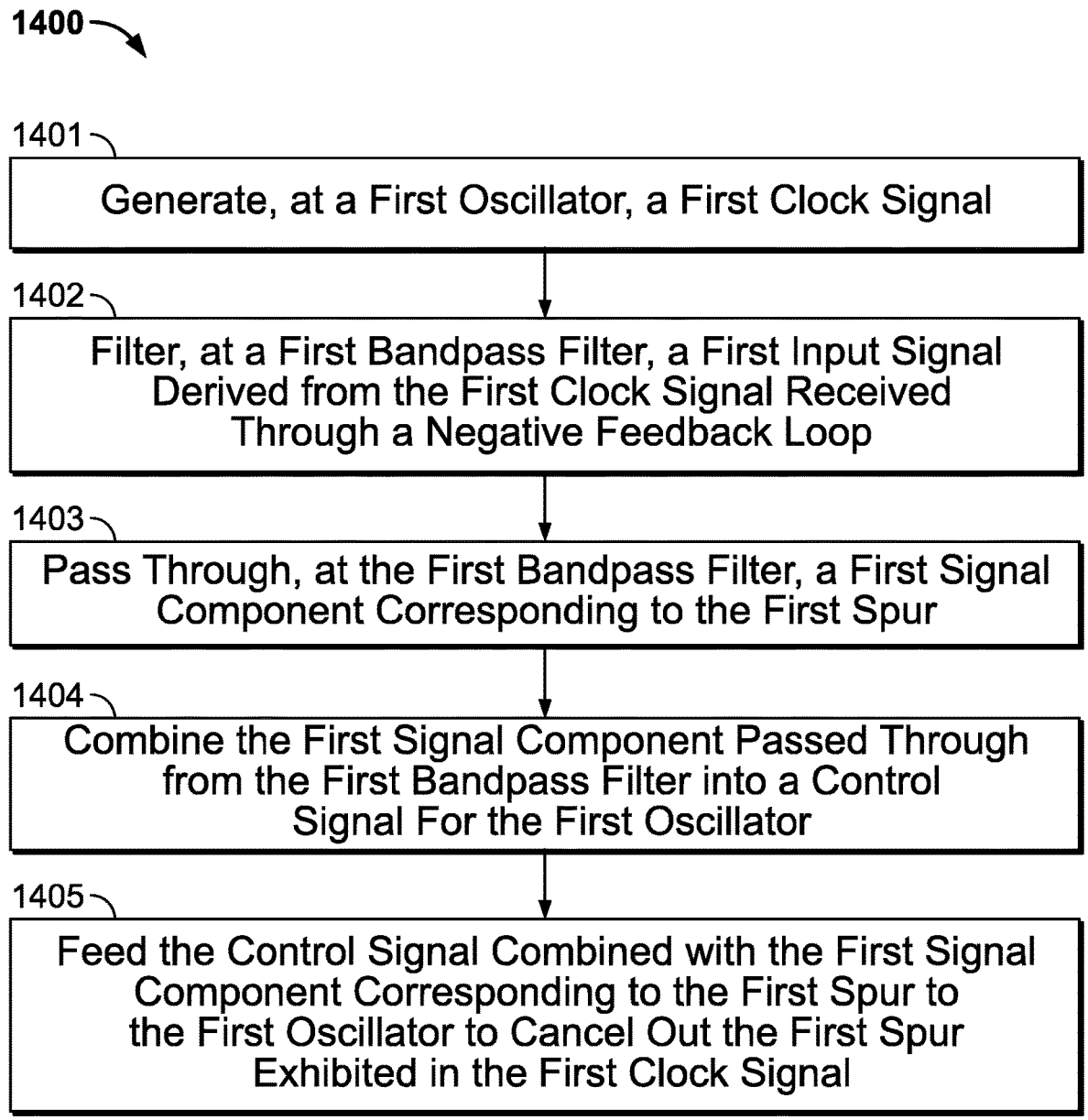
FIG. 14 is a logic flow diagram illustrating an example process of suppressing a spur signal, which may be implemented at the circuitry structure illustrated in FIG. 2, according to some embodiments described herein.

FIG. 14 is a logic flow diagram illustrating an example process 1400 of mitigating a signal spur, which is implemented at the circuitry structure 100 illustrated in FIG. 1, according to some embodiments described herein. At 1401, a first clock signal is generated at a first oscillator (e.g., see oscillator 110 in FIG. 1). The first clock signal exhibits a first signal spur, e.g., a spurious aberration, which is caused by interference from a second oscillator located on the same circuit. At 1402, a first input signal derived from the first clock signal received through a negative feedback loop is filtered at a bandpass filter (e.g., see 120 in FIG. 1). The first input signal contains a first signal component substantially equivalent to a reverse of a signal spur that occurs at the oscillator. At 1403, the first signal component is passed through at the first bandpass filter (e.g., see 120 in FIG. 1). At 1404, the first signal component passed through from the first bandpass filter is combined into a control signal generated for the first oscillator (e.g., see 110 in FIG. 1). At 1405, the control signal combined with the first signal component corresponding to the first signal spur is fed to the oscillator (e.g., see 110 in FIG. 1) to mitigate or cancel out the first signal spur exhibited in the first clock signal.

Figure 15:
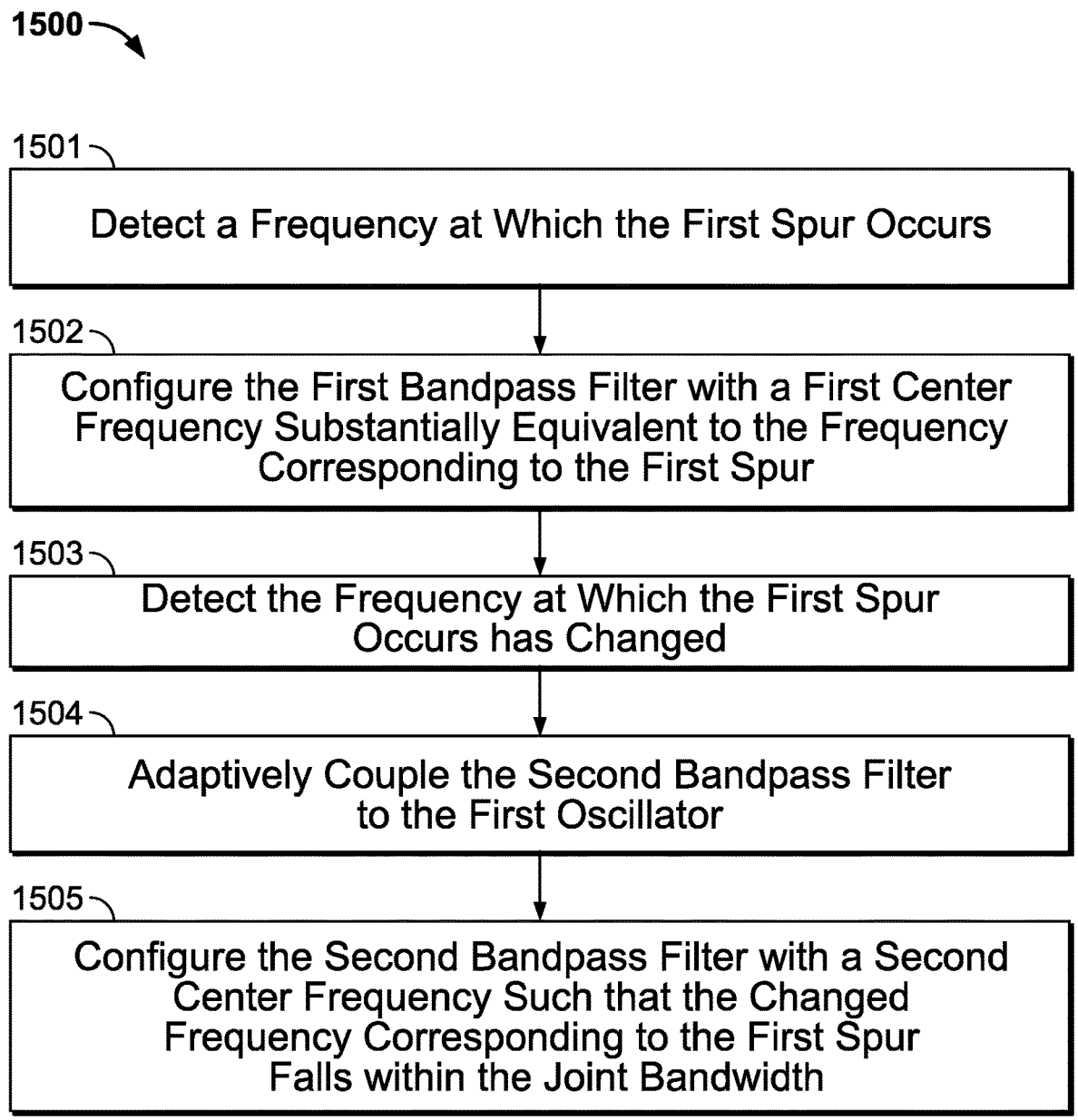
FIG. 15 is a logic flow diagram illustrating an example process of adaptive spur suppression, which may be implemented at the circuitry structure illustrated in FIG. 4, according to some embodiments described herein.

FIG. 15 is a logic flow diagram illustrating an example process 1500 of adaptive spur suppression, which may be implemented at the circuitry structures illustrated in FIGS. 4 and 6, according to some embodiments described herein. At 1501, the frequency at which a signal spur occurs (e.g., see output spur 122 in FIG. 4) is detected. For example, detection of the frequency of the first spur signal is implemented when the second bandpass filter is decoupled, as shown in FIG. 13. At 1502, the first bandpass filter (e.g., see bandpass filter 120 in FIG. 4) is configured with a first center frequency that matches the frequency of the first signal spur (e.g., see spur 122 in FIG. 4). At 1503, the frequency of the first signal spur is detected to have changed, e.g., the configured center frequency of the first bandpass filter no longer matches with the changed frequency of the signal spur. At 1504, in response to detecting that the frequency of the first signal spur has changed, the second bandpass filter (e.g., see 130 in FIGS. 4 and 6) is coupled to the oscillator (e.g., see 110 in FIG. 6). At 1505, the second bandpass filter (e.g., see 130 in FIGS. 4 and 6) is configured with a second center frequency and a bandwidth such that a combined bandwidth of the first bandpass filter and the second bandpass filter covers the changed frequency of the first signal spur.

In some embodiments, when the frequency of the signal spur changes over time and no longer matches with the selected frequency of the first bandpass filter from 1502, the first center frequency of the first bandpass filter or the second center frequency of the second bandpass filter is adaptively tuned such that the frequency of the spur signal still falls within a combined bandwidth of the first bandpass filter and the second bandpass filter. The tuning process is further described below in relation to FIG. 16.

Figure 16:
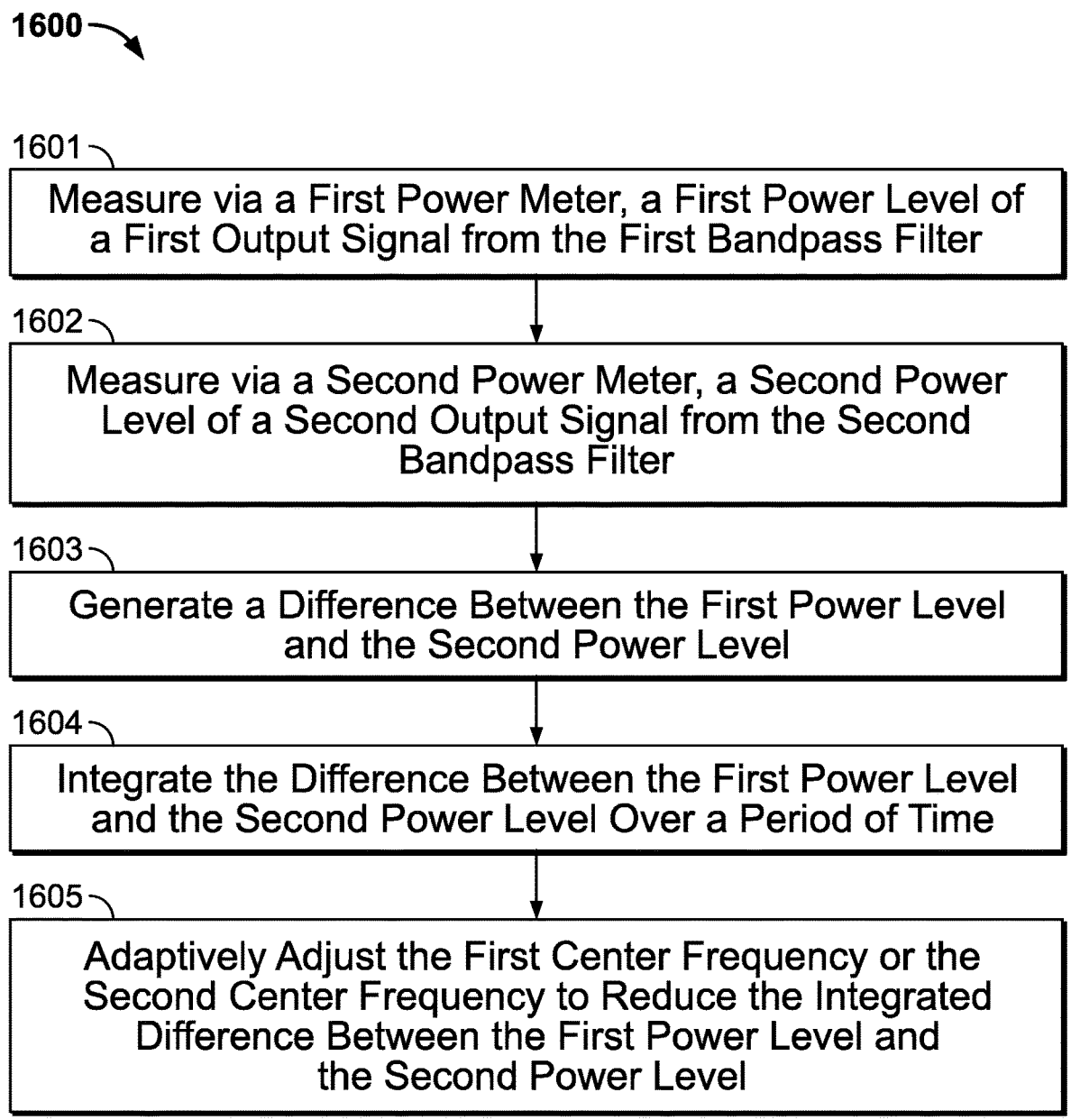
FIG. 16 is a logic flow diagram illustrating an example process of resonator tuning for adaptive spur suppression, which may be implemented at the circuitry structure illustrated in FIG. 12, according to some embodiments described herein.

FIG. 16 is a logic flow diagram illustrating an example process 1600 of resonator tuning for adaptive spur suppression, which may be implemented at the circuitry structure illustrated in FIG. 12, according to some embodiments described herein. At 1601, a first power meter (e.g., see 161 in FIG. 12) is configured to measure a first power level of a first output signal (e.g., 141 in FIG. 12) from the first bandpass filter (e.g., see 130 in FIG. 12). At 1602, a second power meter (e.g., see 162 in FIG. 12), a second power level of a second output signal (e.g., see 142 in FIG. 12) from the second bandpass filter (e.g., see 120 in FIG. 12). At 1603, a difference is calculated between the first power level and the second power level. At 1604, an accumulator or integrator (e.g., see 170 in FIG. 12) is configured to integrate the difference between the first power level and the second power level over a period of time. At 1605, the first center frequency or the second center frequency is adjusted to reduce the integrated difference between the first power level and the second power level over a period of time, e.g., as discussed in relation to FIG. 12.

Various embodiments discussed in conjunction with FIGS. 1-16 are performed by various electronic components of one or more electronic circuits, such as but not limited to an integrated circuit, DSP, and/or the like. Various components discussed throughout this disclosure such as, but not limited to oscillators (e.g., 110 in FIG. 1), a loop filter (e.g., 105 in FIG. 1), a bandpass filter or a resonator (e.g., 120, 130 in FIGS. 2, 4, 6, 8, 10, etc.), a power meter (e.g., 161, 162 in FIG. 12), an accumulator (e.g., 170 in FIG. 12), an adder (e.g., 165 in FIG. 12), and/or the like, are configured to include a set of electronic circuit components, and communicatively operate on one or more electronic circuits. Each electronic circuit is configured to include any of, but not limited to logic gates, memory cells, amplifiers, filters, and/or the like. Various embodiments and components disclosed herein are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 10 does not necessarily require the particular order shown, or sequential order, to achieve desirable results. In certain implementations, multitasking and parallel processing may be advantageous. Other variations are within the scope of the following claims.

What is claimed is:

1. An electronic device, comprising:
  a first oscillator configured to output a first clock signal,
  a second oscillator that is co-located with the first oscillator on the electronic device,
    wherein the second oscillator is configured to output a second clock signal,
    wherein the first clock signal exhibits a first signal spur caused by the second oscillator or by the second clock signal;
  a first bandpass filter configured to filter a first input signal derived from the first clock signal received through a negative feedback loop, and to output a first signal component corresponding to the first signal spur; and
  a signal reconstruction circuit configured to receive the first signal component and to combine the first signal component into a control signal for the first oscillator, and to feed the control signal combined with the first signal component to the first oscillator to mitigate the first signal spur exhibited in the first clock signal.

2. The electronic device of claim 1, further comprising:
  a spur detection component configured to determine a frequency or a bandwidth at which the first signal spur occurs,
  wherein the first bandpass filter is configured with a center frequency corresponding to the determined frequency, and a pass bandwidth corresponding to the bandwidth, and
  wherein the first signal component that is passed through by the first bandpass filter is substantially equivalent to a reverse of the first signal spur to cancel out the first signal spur.

3. The electronic device of claim 2, wherein the spur detection component comprises:
  a power monitor coupled to the first bandpass filter, wherein the power monitor is configured to monitor for a spurious aberration in a power level of an output signal from the first bandpass filter; and
  a spectrum analyzer coupled to the first bandpass filter, wherein the spectrum analyzer is configured to measure a frequency or a bandwidth of the output signal from the first bandpass filter when the spurious aberration in the power level of the output signal is detected,
    wherein the measured frequency or the measured bandwidth corresponds to the frequency or the bandwidth at which the first signal spur occurs.

4. The electronic device of claim 3, wherein the first bandpass filter is adaptively configured with the center frequency that is adaptively selected based on dynamic monitoring and measuring of the spurious aberration in the power level of the output signal from the first bandpass filter.

5. The electronic device of claim 1, wherein the first oscillator is a digitally controlled oscillator,
  wherein the first bandpass filter comprises a digital resonator that is implemented as a two-tap finite impulse response filter, and
  wherein the two-tap finite impulse response filter is configured with coefficients selected to allow the first signal component to pass through the two-tap finite impulse response filter.

6. The electronic device of claim 1, wherein the first clock signal exhibits a second signal spur caused by a third oscillator that is co-located on the electronic device, and the electronic device further comprising:
  a second bandpass filter placed in parallel to the first bandpass filter,
  wherein the second bandpass filter is configured to filter the first input signal derived from the first clock signal received through the negative feedback loop and pass through a second signal component from the first input signal, and
  wherein the second signal component is substantially equivalent to a reverse of the second signal spur to cancel out the second signal spur.

7. The electronic device of claim 1, further comprising:
  a second bandpass filter selectively decoupled from or coupled to the first oscillator, wherein the first bandpass filter is configured with a first bandwidth and the second bandpass filter is configured with a second bandwidth, and wherein the first bandwidth corresponding to the first bandpass filter overlaps with the second bandwidth of the second bandpass filter to form a joint bandwidth that covers a range of varying frequencies of the first signal spur.

8. The electronic device of claim 6, wherein the second bandpass filter is adaptively decoupled from the first oscillator when the first bandpass filter is configured with a first center frequency that is substantially equivalent to a frequency at which the first signal spur occurs, and wherein the second bandpass filter is adaptively coupled to the first oscillator when the frequency at which the first signal spur occurs has changed and the changed frequency falls within the joint bandwidth.

9. The electronic device of claim 8, further comprising:

a first power meter configured to measure a first power level of a first output signal from the first bandpass filter;

a second power meter configured to measure a second power level of a second output signal from the second bandpass filter;

an adder configured to generate a difference between the first power level and the second power level; and an accumulator coupled to the first bandpass filter and the second bandpass filter, wherein the accumulator is configured to integrate the difference between the first power level and the second power level over a period of time, wherein the first center frequency or the second center frequency is selectively adjusted to reduce the integrated difference between the first power level and the second power level.

10. The electronic device of claim 1, wherein the signal reconstruction circuit comprises:

a loop filter placed in parallel to the first bandpass filter, wherein the loop filter is configured to filter and enhance the first input signal derived from the first clock signal through the negative feedback loop to generate the control signal for the first oscillator, and wherein the generated control signal from the loop filter is combined with the first signal component.

11. A method for mitigating oscillator spurs caused by interference between two or more oscillators disposed on an electronic device, comprising:

generating, at a first oscillator, a first clock signal, wherein the first clock signal exhibits a first signal spur caused by a second oscillator that is co-located on the electronic device, and the second oscillator is configured to output a second clock signal;

filtering, at a first bandpass filter, a first input signal derived from the first clock signal received through a negative feedback loop;

outputting, at the first bandpass filter, a first signal component corresponding to the first spur;

receiving and combining the first signal component into a control signal for the first oscillator; and feeding the control signal combined with the first signal component corresponding to the first signal spur to the first oscillator to mitigate the first signal spur exhibited in the first clock signal.

12. The method of claim 11, further comprising:

determining, at a spur detection component, a frequency or a bandwidth at which the first signal spur occurs;

configuring the first bandpass filter with a center frequency corresponding to the determined frequency, and a pass bandwidth corresponding to the bandwidth; and outputting, by the first bandpass filter, the first signal component to be substantially equivalent to a reverse of the first signal spur to mitigate the first signal spur.

13. The method of claim 12, further comprising:

monitoring, via a power monitor coupled to the first bandpass filter, a power level of an output signal from the first bandpass filter for a spurious aberration; and measuring, via a spectrum analyzer coupled to the first bandpass filter, a frequency or a bandwidth of the output signal from the first bandpass filter when the spurious aberration in the power level of the output signal is detected, wherein the measured frequency or the measured bandwidth corresponds to the frequency or the bandwidth at which the first signal spur occurs.

14. The method of claim 13, further comprising:

selecting the center frequency for the first bandpass filter based on dynamic monitoring and measuring of the spurious aberration in the power level of the output signals from the first bandpass filter.

15. The method of claim 13, wherein the first oscillator is a digitally controlled oscillator, and wherein the first bandpass filter comprises a digital resonator that is implemented as a two-tap finite impulse response filter, and the method further comprising:

selecting coefficients for the two-tap finite impulse response filter to allow the first signal component to pass through the two-tap finite impulse response filter.

16. The method of claim 11, wherein the first clock signal exhibits a second signal spur caused by a third oscillator that is co-located on the electronic device, and the method further comprising:

filtering, via a second bandpass filter placed in parallel to the first bandpass filter, the first input signal derived from the first clock signal received through the negative feedback loop and pass through a second signal component from the first input signal, and wherein the second signal component is substantially equivalent to a reverse of the second signal spur to cancel out the second signal spur.

17. The method of claim 11, further comprising:

selectively decoupling a second bandpass filter from, or coupling the second bandpass filter to the first oscillator, wherein the first bandpass filter is configured with a first bandwidth and the second bandpass filter is configured with a second bandwidth; and selecting the first bandwidth corresponding to the first bandpass filter to overlap with the second bandwidth of the second bandpass filter to form a joint bandwidth that covers a range of varying frequencies of the first signal spur.

18. The method of claim 17, further comprising:

detecting a frequency at which the first signal spur occurs;

configuring the first bandpass filter with a first center frequency substantially equivalent to the frequency corresponding to the first signal spur;

detecting the frequency at which the first signal spur occurs has changed;

in response to detecting that the frequency at which the first signal spur occurs has changed, adaptively coupling the second bandpass filter to the first oscillator; and configuring the second bandpass filter with a second center frequency such that the changed frequency corresponding to the first signal spur falls within the joint bandwidth.

19. The method of claim 18, further comprising:

measuring, via a first power meter, a first power level of a first output signal from the first bandpass filter;

measuring, via a second power meter, a second power level of a second output signal from the second bandpass filter;

calculating a difference between the first power level and the second power level;

integrating, via an accumulator coupled to the first bandpass filter and the second bandpass filter, the difference between the first power level and the second power level over a period of time; and adjusting, in response to the integrated difference between the first power level and the second power level over a period of time, the first center frequency or the second center frequency to reduce the integrated difference between the first power level and the second power level.

20. The method of claim 11, further comprising:

filtering and enhancing, via a loop filter placed in parallel to the first bandpass filter, the first input signal derived from the first clock signal through the negative feedback loop to generate the control signal for the first oscillator, and combining the generated control signal with the first signal component before feeding the generated control signal to the first oscillator.

* * * * *